United States Patent

Itoh

[11] Patent Number: 6,088,080
[45] Date of Patent: Jul. 11, 2000

[54] EXPOSURE APPARATUS AND DEVICE MANUFACTURING METHOD

[75] Inventor: Hiroyuki Itoh, Utsunomiya, Japan

[73] Assignee: Canon Kabushiki Kaisha, Tokyo, Japan

[21] Appl. No.: 09/065,524

[22] Filed: Apr. 24, 1998

[30] Foreign Application Priority Data

Apr. 28, 1997 [JP] Japan .................................. 9-122788

[51] Int. Cl.[7] ........................... G03B 27/42; G03B 27/52; G03B 27/68
[52] U.S. Cl. .............................. 355/30; 355/52; 355/53; 355/55
[58] Field of Search ................................ 355/30, 52, 53, 355/55; 250/443.1; 359/512

[56] References Cited

U.S. PATENT DOCUMENTS

| | | |
|---|---|---|
| 4,564,284 | 1/1986 | Tsutsui ...................................... 355/30 |
| 4,699,505 | 10/1987 | Komoriya et al. ......................... 355/30 |
| 5,063,582 | 11/1991 | Mori et al. ................................. 355/30 |
| 5,231,291 | 7/1993 | Amemiya et al. .................... 250/443.1 |
| 5,329,126 | 7/1994 | Amemiya et al. ................. 250/453.11 |
| 5,825,470 | 10/1998 | Miyai et al. ............................... 355/53 |

*Primary Examiner*—Alan A. Mathews
*Attorney, Agent, or Firm*—Fitzpatrick, Cella, Harper & Scinto

[57] ABSTRACT

An exposure apparatus includes a stage for holding a substrate at an exposure station, an arm mechanism for conveying a substrate to be exposed, onto the stage, and a sensor provided on one of the stage and the arm mechanism, for measuring temperature of the substrate to be exposed. On the basis of the measured temperature, pattern projection magnification to the workpiece, for example, is corrected.

13 Claims, 6 Drawing Sheets

EXPOSURE APPARATUS AND DEVICE MANUFACTURING METHOD

FIELD OF THE INVENTION AND RELATED ART

This invention relates to an exposure apparatus and a device manufacturing method using the same.

In an exposure process for manufacture of a semiconductor device, particularly, a liquid crystal panel, a silicone wafer or a glass substrate which is a workpiece is influenced by temperature of external environment, and expansion or contraction occurs. The workpiece when expanded or contracted by temperature change causes a change in magnification of a pattern formed thereon. Thus, exposure apparatuses perform an exposure process while measuring and correcting the magnification. Conventionally, in order to minimize magnification change, the workpiece temperature is controlled at 23° C. which is set as a reference temperature.

A known method for workpiece temperature control is that: a metal member (hereinafter "cooling plate) having a large thermal capacity is set at a reference temperature, and a workpiece is contacted to this cooling plate or, alternatively, a temperature controlled air is flown to the space adjacent to the workpiece. For a silicone wafer, since it has a high heat transfer coefficient and a low linear thermal expansion coefficient, with the method described above, the temperature of a wafer can be stabilized at a predetermined temperature in a short time.

On the other hand, a glass material which is a workpiece of liquid crystal panel has a low heat transfer coefficient and a high linear thermal expansion coefficient. Namely, a large magnification change occurs with a small temperature change. Also, once temperature change occurs, it takes a long time until a predetermined temperature is resumed by control. Additionally, for glasses, there is a tendency that the size of glass itself decreases with elapse of thermal processes. In exposure apparatuses, magnification correction should be done to meet such reduction tendency of glass material as well as a magnification change due to such temperature change. Also, at the same time, the throughput should be enlarged. For these reasons, it is required that workpieces are controlled to a predetermined temperature just before they are introduced into an exposure apparatus, and also that a plurality of cooling plate are used to prevent decrease of throughput.

As a result of recent considerable enlargement of the size of glass of a liquid crystal panel, a large space is required for the cooling plate and it causes enlargement of the apparatus and then enlargement of the cooling room. This leads to an increase of cost for product panels. Further, stabilizing the workpiece temperature by using temperature controlled airs needs a long time and, if the throughput of the apparatus is taken into account, it will not be a practicable method.

On the other hand, since in many cases registration error is found in a later stage (post process), it is desired that the data concerning the temperature and magnification correction condition with which a defective panel has been processed is memorized for production control.

In conventional exposure apparatuses, it is assumed that the workpiece temperature is constant. While there is a necessity of using a separate device (such as a cooling plate for a resist coater) to make the temperature constant or of providing within the exposure apparatus an equipment for making the workpiece temperature constant, even though an equipment for maintaining constant temperature is provided, there still remains a small error in the workpiece temperature. Additionally, the longer the time until the exposure process starts, the larger the possibility of temperature dispersion among workpieces is.

Further, in conventional exposure apparatuses, for registration of a mask pattern with workpieces having been expanded or contracted by temperature change, substrate magnification measurement has be be done for every workpiece and, additionally, magnification correction corresponding to a measured result has to be done for every workpiece.

In some of conventional exposure apparatuses, for improvement of throughput, magnification measurement is performed with respect to a first one of the workpiece lot or, alternatively, an average of magnifications measured with respect to first several workpieces of the lot is calculated. Then, for workpieces introduced thereafter, only registration is performed without executing the magnification measurement. In such case, as compared with the method wherein the overlay precision is checked in every workpiece by magnification measurement, the registration precision may be deteriorated as a result of workpiece temperature differences.

In exposure apparatuses, magnification correction is made and then exposure process is performed. However, there is no measure for checking whether the magnification correction has been made accurately or not. If registration error is found at a later process, such error can not be examined whether it attributes to a problem involved in the exposure apparatus or to the workpiece.

Further, in conventional exposure apparatuses, there is no means for measuring the workpiece. Thus, even when a workpiece which is beyond magnification correctable range of the exposure apparatus is introduced, it can not be discriminated whether the problem attributes to the workpiece itself or to the temperature of the workpiece.

SUMMARY OF THE INVENTION

In accordance with an aspect of the present invention, there is provided an exposure apparatus, comprising: a stage for holding a substrate at an exposure station; an arm mechanism for conveying a substrate to be exposed, onto said stage; and a sensor provided on one of said stage and said arm mechanism, for measuring temperature of the substrate to be exposed.

In accordance with another aspect of the present invention, there is provided a device manufacturing method wherein the temperature of a substrate is measured and then the exposure process for the substrate is performed. The measured temperature of the substrate may be used for magnification correction, for example, for the exposure process.

In one preferred form of the present invention, there are a plurality of sensors each as aforesaid, which are provided on the stage or the arm, for measuring the temperature of the substrate held by the stage or the arm.

In accordance with another preferred from of the present invention, there is a projection optical system for projecting a pattern on to a substrate at a predetermined magnification, and magnification correcting means for correcting the magnification in accordance with a measured temperature of the substrate. Said magnification correcting means may change the magnification of said projection optical system to meet a change in size of the substrate as the temperature of the substrate changes from a predetermined reference temperature to the temperature measured. Said magnification correcting means may use, as the reference temperature, a temperature measured by said sensor, of a first substrate of a lot of substrates which substrate is to be exposed first. Said magnification correcting means may use, as the reference temperature, a reference temperature being set with respect to a predetermined process related to the substrate.

The magnification correction such as described above effectively avoids the necessity of control of the substrate temperature to a predetermined temperature through a cooling plate or the necessity of optically measuring a correction value of projection magnification for every substrate.

In a further preferred form of the present invention, there is memorizing means for storing therein a measured temperature of every substrate. If misregistration is found at a later stage, the cause therefor can be investigated. In a still further preferred form of the present invention, there is output means for producing a predetermined output when the measured temperature of the substrate is outside a predetermined range. This effectively prevents misregistration, for example.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

First Embodiment

Figure 1:
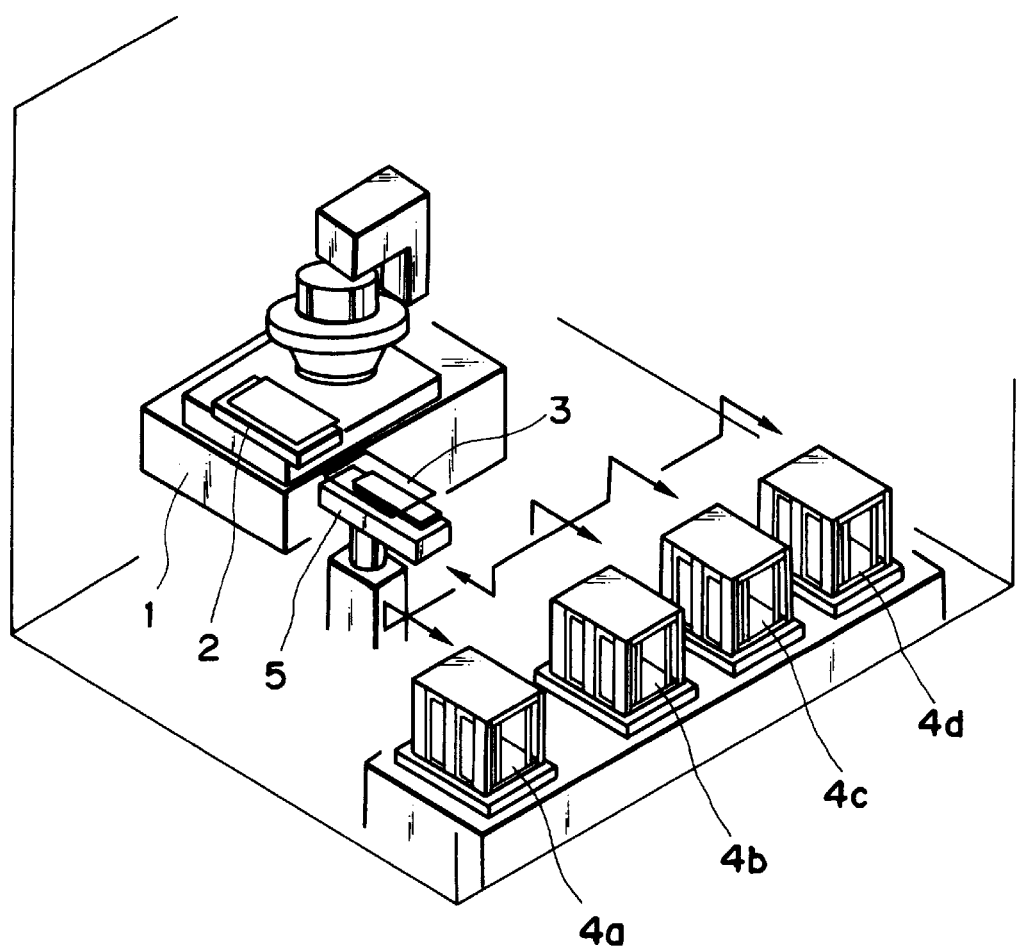
FIG. 1 is a schematic and perspective view of an exposure apparatus according to a first embodiment of the present invention.

FIG. 1 is a perspective view of an exposure apparatus according to a first embodiment of the present invention. As shown in FIG. 1, a plurality of workpieces (substrates to be exposed) such as liquid crystal panel substrates or semiconductor wafers, constituting one lot, are accommodated in associated one of cassettes 4a–4c. Thus, each cassette accommodates therein one lot of workpieces. The workpieces stored in these cassettes 4a–4c are taken out of the cassettes, one by one, and each workpiece is introduced onto an exposure stage 2 of the exposure apparatus by means of an interface arm 5.

Figure 2:
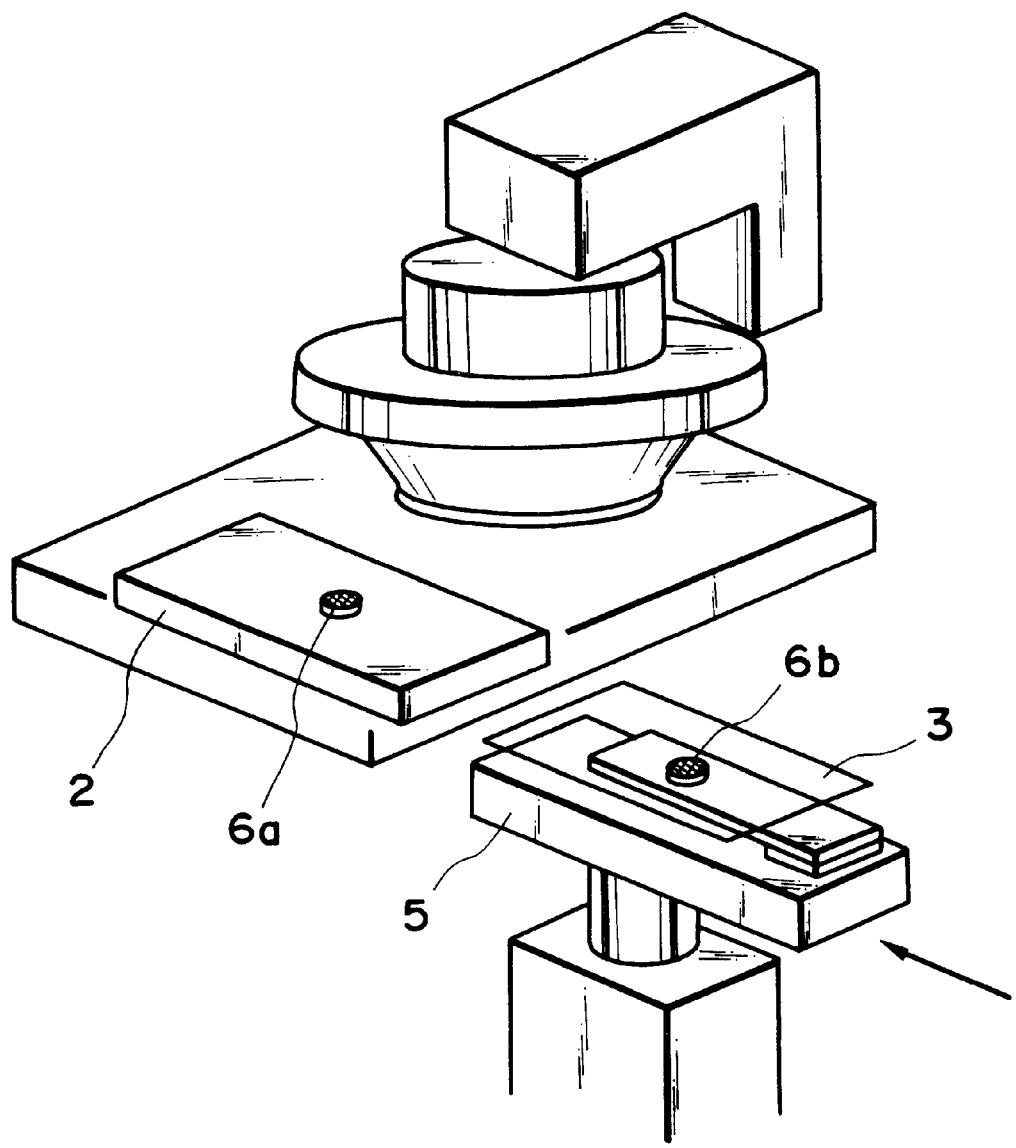
FIG. 2 is a schematic and perspective view for explaining disposition of sensors in the exposure apparatus of FIG. 1.

FIG. 2 is a perspective view for explaining disposition of temperature sensors of the exposure apparatus. As shown in the drawing, there is a temperature sensor 6b or 6a which may be mounted on the interface arm 5 or the exposure stage 2.

Figure 3:
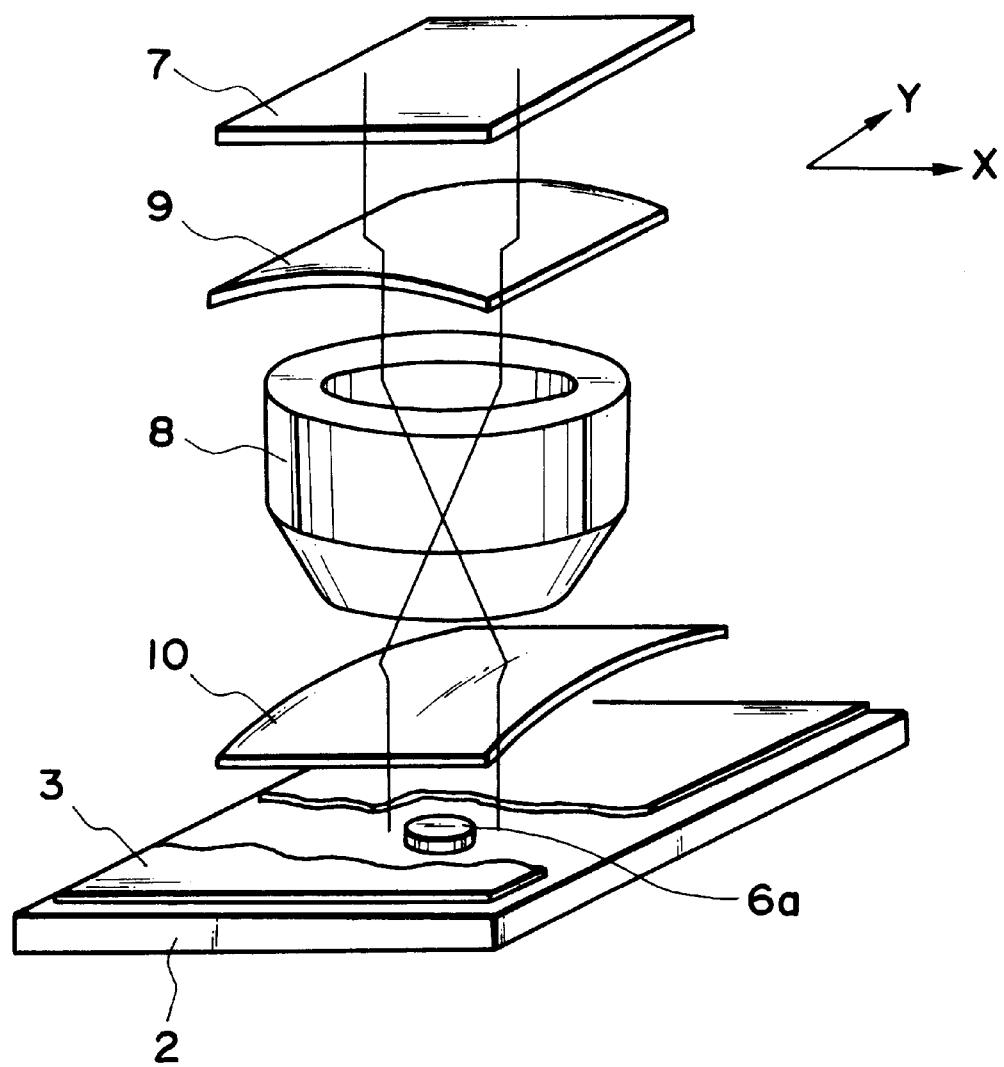
FIG. 3 is a schematic and perspective view of a magnification correcting mechanism in the exposure apparatus of FIG. 1.

FIG. 3 is a perspective view of magnification correcting means of this exposure apparatus. Denoted in the drawing at 7 is a mask having a pattern to be printed on a workpiece 3. Denoted at 8 is a projection optical system for projecting an image of the mask pattern on to the workpiece 3, and denoted at 9 is an X-axis magnification correcting mechanism which is disposed between the mask and the projection optical system 8. Denoted at 10 is a Y-axis magnification correcting mechanism disposed between the projection optical system 8 and the workpiece 3. Each of the magnification correcting mechanisms 9 and 10 may comprise, for example, a transparent plate-like member and means for flexing or curving the plate-like member, and it may serve to correct the projection magnification by changing the curvature of the plate-like member. These magnification correcting mechanisms provide magnification correcting means.

In the structure described above, as shown in FIG. 4, for a second layer exposure process or for a later layer exposure process, a first workpiece of any one of the cassettes 4a–4c is introduced into the exposure apparatus by means of the interface arm 5 (step S1). The temperature of this workpiece is measured by the sensor 6a or 6b (step S2). The measured temperature is registered in the exposure apparatus as a reference temperature (step S3). Subsequently, whether the measured temperature is within a predetermined tolerance range or not is discriminated (step S4) and, if not, an alarm is produced (step S5). Then, in accordance with exposure sequence, alignment operation for the workpiece and the mask is performed and, thereafter, magnification measurement to the workpiece is executed (step S6). On the basis of the result of measurement, magnification correction is made and exposure is performed (step S8). The measured magnification of the workpiece is registered in the exposure apparatus as a reference magnification (step S7).

Subsequently, a next workpiece is conveyed on to the exposure stage 2 by the interface arm 5 (step S9) and, additionally, the temperature of that workpiece is measured by means of the sensor 6a or 6b (step S10). The measured temperature is memorized (step S11). Also, whether the measured temperature is within the tolerance range or not is discriminated (step S12) and, if not, a corresponding alarm is produced (step S13).

Then, pattern registration of the workpiece and the mask is performed. After that, without performing magnification measurement, magnification correction is carried out on the basis of the reference magnification having been stored at step S8 and of any temperature difference between the measured temperature (step S10) and the reference temperature as registered at step S3. Exposure process is then performed. More specifically, a magnification change corresponding to the temperature difference from the reference temperature is calculated (step S14), and magnification correction data for determining an increased or decreased magnification with respect to the reference magnification is produced. On the basis of the thus prepared correction data, the magnification correcting means is actuated and exposure process is performed (step S15).

After that, the sequence returns to step S9 and the procedure from step S9 to step S15 is repeated to perform the exposure procedure to each of the remaining workpieces in the lot.

Here, the temperatures of the workpieces having been memorized at step S11 may be used for examination of any problem such as misregistration, to be found at a later process, as exposure history concerning magnification corrections having been done with respect to respective workpieces.

Second Embodiment

The first embodiment described above relates to the procedure for second layer exposure or a later layer exposure, wherein the pattern of a mask and a pattern of a workpiece are to be registered. The second embodiment to be described below concerns the procedure for first layer exposure wherein each workpiece has no pattern formed thereon.

Figure 4:
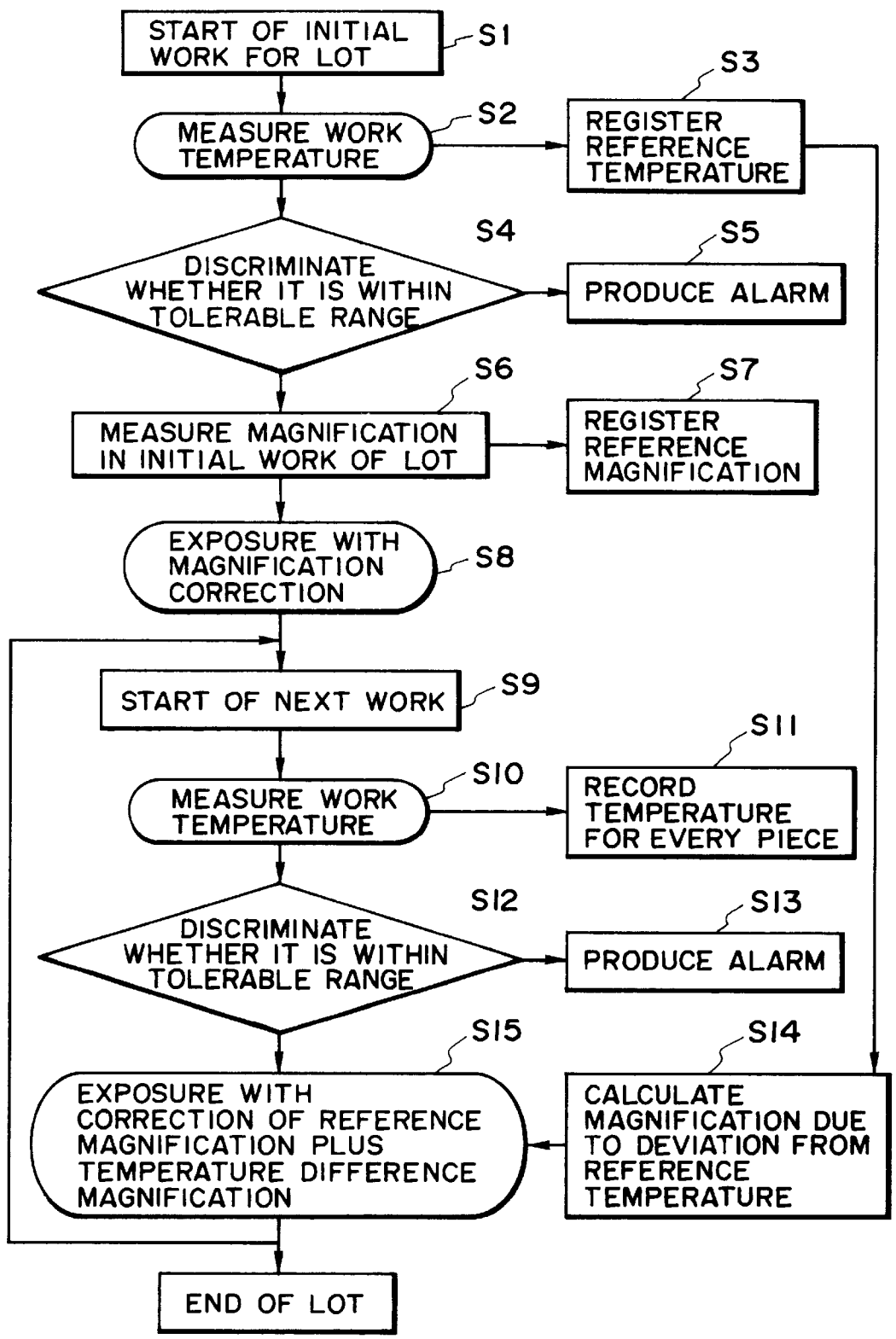
FIG. 4 is a flow chart of exposure procedure including temperature measurement and magnification correction, to be made in the exposure apparatus of FIG. 1.

Generally, a semiconductor exposure system including an exposure apparatus and workpieces in that system have a set reference temperature of 23° C. In consideration of this, also in the exposure process of the first layer, the exposure process may be done with magnification correction corresponding to a temperature change from the same reference temperature of 23° C. This enables constant and exact dimensional precision at the reference temperature to those workpieces having been processed up to the final process. Namely, in place of using the temperature of the first workpiece, the set reference temperature of 23° C. may be used. Except for this, substantially the same procedure as shown in FIG. 4 may be carried out.

As described above, for exposure of a workpiece, the temperature of the workpiece is measured and, on the basis of the measured temperature, the projection magnification is corrected. This enable maintaining overlay precision without measuring a correction value of projection magnification for every workpiece. Thus, the throughput can be increased. Further, the temperature control for the process or processes before the exposure process may be loosened. Moreover, there is no necessity of using specific means for maintaining the workpiece temperature inside the exposure apparatus very strictly, and the space to be occupied by the exposure apparatus can be made smaller.

Further, since the workpiece temperature at the time of workpiece exposure is measured and the measured temperature is memorized, if there is a problem such as misregistration found at a later stage, the exposure history concerning what magnification correction has been done to every workpiece can be referred to for examination of the problem. This effectively contributes to production control.

Further, the workpiece temperature at the workpiece exposure process is measured and, if the measured temperature is outside a predetermined range, a corresponding output is produced. This effectively prevents misregistration, for example.

Next, an embodiment of device manufacturing method which uses an exposure apparatus such as described above, will be explained.

Figure 5:
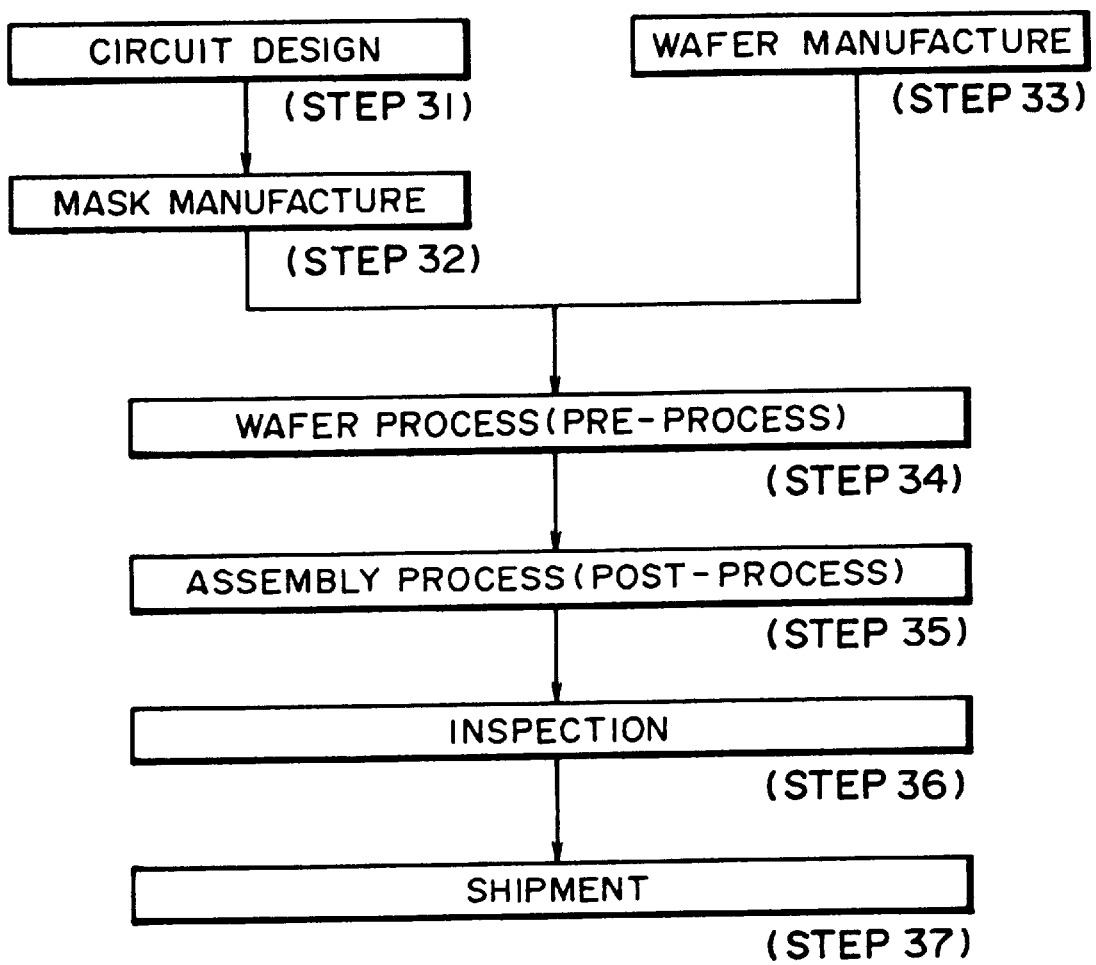
FIG. 5 is a flow chart of microdevice manufacturing processes wherein the exposure apparatus of FIG. 1 is used.

FIG. 5 is a flow chart of procedure for manufacture of microdevices such as semiconductor chips (e.g. ICs or LSIs), liquid crystal panels, CCDs, thin film magnetic heads or micro-machines, for example. Step 31 is a design process for designing a circuit of a semiconductor device. Step 32 is a process for making a mask on the basis of the circuit pattern design. Step 33 is a process for preparing a wafer by using a material such as silicon. Step 34 is a wafer process which is called a pre-process wherein, by using the so prepared mask and wafer, circuits are practically formed on the wafer through lithography. Step 35 subsequent to this is an assembling step which is called a post-process wherein the wafer having been processed by step 34 is formed into semiconductor chips. This step includes assembling (dicing and bonding) process and packaging (chip sealing) process. Step 36 is an inspection step wherein operation check, durability check and so on for the semiconductor devices provided by step 35, are carried out. With these processes, semiconductor devices are completed and they are shipped (step 37).

Figure 6:
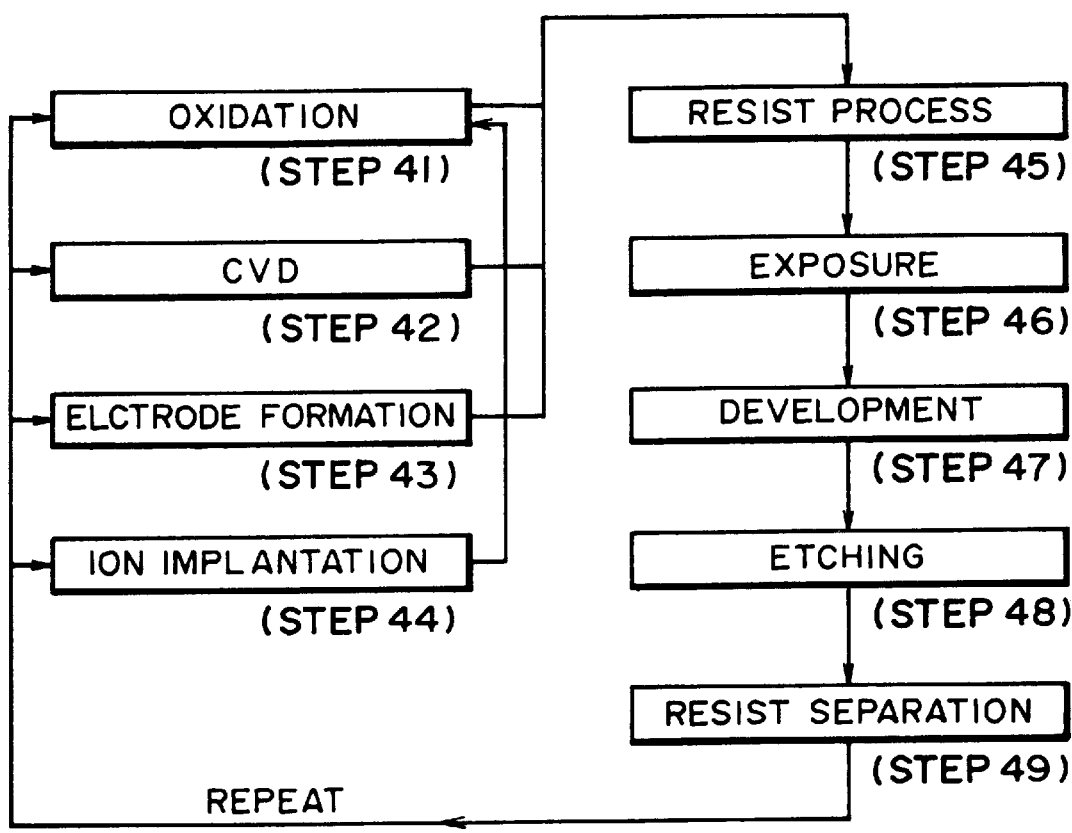
FIG. 6 is a flow chart for explaining details of the wafer process included in the procedure of FIG. 5.

FIG. 6 is a flow chart showing details of the wafer process. Step 41 is an oxidation process for oxidizing the surface of a wafer. Step 42 is a CVD process for forming an insulating film on the wafer surface. Step 43 is an electrode forming process for forming electrodes upon the wafer by vapor deposition. Step 44 is an ion implanting process for implanting ions to the wafer. Step 45 is a resist process for applying a resist (photosensitive material) to the wafer. Step 46 is an exposure process for printing, by exposure, the circuit pattern of the mask on the wafer through the exposure apparatus described above. Step 47 is a developing process for developing the exposed wafer. Step 48 is an etching process for removing portions other than the developed resist image. Step 49 is a resist separation process for separating the resist material remaining on the wafer after being subjected to the etching process. By repeating these processes, circuit patterns are superposedly formed on the wafer.

With these processes, high density microdevices can be manufactured with smaller cost.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus, comprising:
   a stage for holding a substrate at an exposure station;
   an arm mechanism for conveying a substrate to be exposed onto said stage;
   a sensor provided on one of said stage and said arm mechanism, for measuring a temperature of the substrate to be exposed;
   a projection optical system for projecting a pattern on to a substrate at a predetermined magnification; and
   magnification correcting means for correcting the magnification in accordance with a measured temperature of the substrate, wherein said magnification correcting means changes the magnification of said projection optical system to meet a change in size of the substrate as the temperature of the substrate changes from a predetermined reference temperature to the temperature measured.

2. An apparatus according to claim 1, wherein said magnification correcting means uses, as the reference temperature, a temperature measured by said sensor, of a first substrate of a lot of substrates which substrate is to be exposed first.

3. An apparatus according to claim 1, wherein said magnification correcting means uses, as the reference temperature, a reference temperature being set with respect to a predetermined process related to the substrate.

4. An apparatus according to claim 1, comprising a plurality of said sensors.

5. An apparatus according to any one of claims 1–3, further comprising memorizing means for storing therein a temperature measured by said sensor.

6. An apparatus according to any one of claims 1–3, further comprising output means for producing a predetermined output when the measured temperature of the substrate is outside a predetermined range.

7. An apparatus according to any one of claims 1–3, wherein the substrate comprises a glass substrate for manufacture of a liquid crystal panel.

8. A device manufacturing method, comprising the steps of:
   measuring a temperature of a substrate;
   correcting a magnification related to projection of a pattern on the substrate in accordance with the measured temperature; and performing exposure of the substrate, wherein said magnification is corrected to meet a change in size of the substrate as the temperature of the substrate changes from a predetermined reference temperature to the temperature measured.

9. A method according to claim 8, wherein, as the reference temperature, a measured temperature of a first substrate of a lot of substrates which substrate is to be exposed first is used.

10. A method according to claim 8, wherein, as the reference temperature, a reference temperature being set with respect to a predetermined process related to the substrate is used.

11. A method according to any one of claims 8–10, wherein the measured temperature of the substrate is memorized.

12. A method according to any one of claims 8–10, wherein a predetermined output is produced when the measured temperature of the substrate is outside a predetermined range.

13. A method according to any one of claims 8–10, wherein the substrate comprises a glass substrate for manufacture of a liquid crystal panel.

* * * * *

UNITED STATES PATENT AND TRADEMARK OFFICE
CERTIFICATE OF CORRECTION

PATENT NO.   : 6,088,080
DATED        : July 11, 2000
INVENTOR(S)  : HIROYUKI ITOH ET AL.

It is certified that error appears in the above-identified patent and that said Letters Patent is hereby corrected as shown below:

COLUMN 1:

Line 10, "workpiece" should read --workpiece,--;
    Line 45, "plate are" should read --plates is--; and
    Line 53, "airs" should read --air--.

COLUMN 2:

Line 8, "be" (first occurrence) should read --to--; and
    Line 35, "attributes" should read --is attributed--.

COLUMN 5:

Line 7, "have" should read --has--.

UNITED STATES PATENT AND TRADEMARK OFFICE
CERTIFICATE OF CORRECTION

PATENT NO. : 6,088,080

DATED : July 11, 2000

INVENTOR(S) : HIROYUKI ITOH ET AL.

It is certified that error appears in the above-identified patent and that said Letters Patent is hereby corrected as shown below:

<u>COLUMN 6</u>:

Line 31, "on to" should read --onto--; and
    Line 32, "a" (first occurrence) should read --the--.

Signed and Sealed this

Twenty-fourth Day of April, 2001

Attest:

NICHOLAS P. GODICI

*Attesting Officer*    *Acting Director of the United States Patent and Trademark Office*